US010192765B2

United States Patent
Koshti et al.

(10) Patent No.: US 10,192,765 B2
(45) Date of Patent: Jan. 29, 2019

(54) SUBSTRATE PROCESSING SYSTEMS, APPARATUS, AND METHODS WITH FACTORY INTERFACE ENVIRONMENTAL CONTROLS

(71) Applicant: Applied Materials, Inc., Santa Clara, CA (US)

(72) Inventors: Sushant S. Koshti, Sunnyvale, CA (US); Dean C. Hruzek, Cedar Park, TX (US); Ayan Majumdar, San Jose, CA (US); John C. Menk, Round Rock, TX (US); Helder T. Lee, San Jose, CA (US); Sangram Patil, Sunnyvale, CA (US); Sanjay Rajaram, Sunnyvale, CA (US); Douglas Baumgarten, Round Rock, TX (US); Nir Merry, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 499 days.

(21) Appl. No.: 14/456,631

(22) Filed: Aug. 11, 2014

(65) Prior Publication Data
US 2015/0045961 A1    Feb. 12, 2015

Related U.S. Application Data

(60) Provisional application No. 61/865,046, filed on Aug. 12, 2013.

(51) Int. Cl.
*H01L 21/67* (2006.01)
*H01L 21/677* (2006.01)

(52) U.S. Cl.
CPC .. *H01L 21/67772* (2013.01); *H01L 21/67207* (2013.01); *H01L 21/67248* (2013.01); *H01L 21/67253* (2013.01)

(58) Field of Classification Search
CPC .......................... H01L 21/67–21/67005; H01L 21/67155–21/67207; H01L 21/67248;
(Continued)

(56) References Cited

U.S. PATENT DOCUMENTS 3,688,540 A * 9/1972 Russel ................. B21B 21/005
72/208
4,781,511 A * 11/1988 Harada ............ H01L 21/67772
118/50

(Continued)

FOREIGN PATENT DOCUMENTS

| CN | 101656199 A | 2/2010 |
| CN | 202888140 U | 4/2013 |

(Continued)

OTHER PUBLICATIONS

Machine Translation of JP2013-120760, WIPO [online], 2017 [retrieved Dec. 3, 2017], Retrieved from Internet: <URL:https://patentscope.wipo.int/search/en/detail.jsf?docId=JP82084228&recNum=1&maxRec=&office=&prevFilter=&sortOption=&queryString=&tab=FullText>, pp. 1-13.*

(Continued)

*Primary Examiner* — Todd Aguilera
(74) *Attorney, Agent, or Firm* — Dugan & Dugan, PC

(57) ABSTRACT

Electronic device processing systems including environmental control of the factory interface are described. One electronic device processing system has a factory interface having a factory interface chamber, a load lock apparatus coupled to the factory interface, one or more substrate carriers coupled to the factory interface, and an environmental control system coupled to the factory interface and operational to monitor or control one of: relative humidity, temperature, an amount of oxygen, or an amount of inert gas within the factory interface chamber. In another aspect, purge of a carrier purge chamber within the factory interface (Continued)

chamber is provided. Methods for processing substrates are described, as are numerous other aspects.

23 Claims, 7 Drawing Sheets

(58) Field of Classification Search
CPC .. H01L 21/67253; H01L 21/67739–21/67781; G05D 23/00–23/02; G05D 23/19; F27B 17/0025; G05B 2219/2602; G05B 2219/2219; G05B 2219/45031; G05B 2219/45032
USPC ........ 700/121, 299; 438/14, 800, 5; 414/217
See application file for complete search history.

(56) References Cited

U.S. PATENT DOCUMENTS

| | | | |
|---|---|---|---|
| 5,853,486 | A | 12/1998 | Ono et al. |
| 6,454,508 | B2 | 9/2002 | Toshima et al. |
| 6,454,519 | B1 | 9/2002 | Toshima et al. |
| 6,599,076 | B2 | 7/2003 | Toshima et al. |
| 6,877,219 | B1* | 4/2005 | Theriault ............... H05K 13/02 219/385 |
| 6,955,197 | B2 | 10/2005 | Elliott et al. |
| 7,059,849 | B2* | 6/2006 | Sakata .................... F27B 5/04 432/233 |
| 7,147,424 | B2 | 12/2006 | Weaver |
| 7,258,520 | B2 | 8/2007 | Weaver |
| 7,299,831 | B2 | 11/2007 | Elliot |
| 7,467,919 | B2 | 12/2008 | Weaver |
| 7,611,319 | B2 | 11/2009 | Shah et al. |
| 8,074,597 | B2 | 12/2011 | Shah et al. |
| 8,443,484 | B2 | 5/2013 | Ozaki et al. |
| 8,601,975 | B2 | 12/2013 | Shah et al. |
| 8,689,812 | B2 | 4/2014 | Shah et al. |
| 8,777,553 | B2* | 7/2014 | Hirano .............. H01L 21/67017 414/805 |
| 8,796,589 | B2 | 8/2014 | Quiles et al. |
| 8,827,695 | B2* | 9/2014 | Hsiao ................ H01L 21/67017 414/172 |
| 9,010,384 | B2* | 4/2015 | Yoshimura ........ H01L 21/67772 141/63 |
| 9,091,491 | B2* | 7/2015 | Lee .......................... F28F 3/12 |
| 9,695,509 | B2* | 7/2017 | Hirano .............. H01L 21/67017 |
| 2002/0023458 | A1* | 2/2002 | Sakata .................... F27B 5/04 62/378 |
| 2003/0002960 | A1 | 1/2003 | Toshima et al. |
| 2003/0031537 | A1 | 2/2003 | Tokunaga |
| 2003/0031538 | A1 | 2/2003 | Weaver |
| 2004/0081546 | A1 | 4/2004 | Elliott et al. |
| 2006/0225299 | A1 | 10/2006 | Kim et al. |
| 2006/0245854 | A1 | 11/2006 | Toshima et al. |
| 2007/0116545 | A1 | 5/2007 | Rice et al. |
| 2007/0140822 | A1 | 6/2007 | Elliott et al. |
| 2007/0295274 | A1 | 12/2007 | Webb et al. |
| 2009/0108544 | A1 | 4/2009 | Sico et al. |
| 2009/0110518 | A1 | 4/2009 | Rice et al. |
| 2009/0129897 | A1 | 5/2009 | Babbs et al. |
| 2009/0169342 | A1 | 7/2009 | Yoshimura et al. |
| 2009/0211742 | A1* | 8/2009 | Lee .......................... F28F 3/12 165/168 |
| 2009/0317214 | A1* | 12/2009 | Hsiao ................ H01L 21/67017 414/217 |
| 2010/0143081 | A1 | 6/2010 | Oh et al. |
| 2010/0178147 | A1 | 7/2010 | Kremerman et al. |
| 2012/0083918 | A1 | 4/2012 | Yamazaki |
| 2012/0237323 | A1 | 9/2012 | Sugawara |
| 2012/0241032 | A1 | 9/2012 | Sugawara |
| 2012/0289058 | A1* | 11/2012 | Hirano .............. H01L 21/67017 438/758 |
| 2013/0000757 | A1* | 1/2013 | Yoshimura ........ H01L 21/67772 137/561 R |
| 2014/0112739 | A1* | 4/2014 | Hirano .............. H01L 21/67017 414/217.1 |
| 2015/0016941 | A1 | 1/2015 | Rice et al. |
| 2016/0035608 | A1* | 2/2016 | Babbs ............... H01L 21/67201 414/217 |

FOREIGN PATENT DOCUMENTS

| | | |
|---|---|---|
| JP | 2000-150613 | 5/2000 |
| JP | 2003-045933 | 2/2003 |
| JP | 2004-311940 | 11/2004 |
| JP | 2009-088437 | 4/2009 |
| JP | 2009-541599 | 11/2009 |
| JP | 2011-512642 | 4/2011 |
| JP | 2013-120760 | 6/2013 |
| TW | 200811926 | 3/2008 |
| WO | WO 2005/124853 | 4/2008 |
| WO | WO 2012/133441 | 10/2012 |

OTHER PUBLICATIONS

Mazzocco et al., U.S. Appl. No. 14/332,976, titled "Carrier Adapter Insert Apparatus and Carrier Adapter Insert Detection Methods," filed Jul. 16, 2014.

Quiles et al, U.S. Appl. No. 14/335,415, titled: "Substrate Processing System, Valve Assembly, and Processing Method," filed Jul. 18, 2014.

Rice et al., U.S. Appl. No. 14/931,520, titled "Substrate Processing Systems, Apparatus, and Methods with Substrate Carrier and Purge Chamber Environmental Controls," filed Nov. 3, 2015.

International Search Report and Written Opinion of International Application No. PCT/US2014/050561 dated Nov. 25, 2014.

International Search Report and Written Opinion of International Application No. PCT/US2015/058761 dated Feb. 15, 2016.

International Preliminary Report on Patentability and Written Opinion of International Application No. PCT/US2014/050561 dated Feb. 25, 2016.

Chinese Search Report of Chinese Application No. 201480043188.6 dated Mar. 27, 2017.

International Preliminary Report on Patentability of International Application No. PCT/US2015/058761 dated Jun. 8, 2017.

Apr. 30, 2018 Reply and Terminal Disclaimer of Mar. 13, 2008 Non-Final Office Action of U.S. Appl. No. 14/931,520.

Taiwan Search Report of Taiwan Application No. 103127667 dated Nov. 8, 2017.

Non-Final Office Action of U.S. Appl. No. 14/931,520 dated Mar. 13, 2018.

Final Office Action of U.S. Appl. No. 14/931,520 dated Jun. 19, 2018.

Japanese Office Action of Japanese Application No. 2016-533494 dated May 29, 2018.

Chinese Search Report of Chinese Application No. 201480043188.6 dated May 21, 2018.

Aug. 9, 2018 Reply to Jun. 19, 2018 Final Office Action of U.S. Appl. No. 14/931,520.

Advisory Action of U.S. Appl. No. 14/931,520 dated Aug. 16, 2018.

Japanese Office Action of Japanese Application No. 2016-533494 (21149/PCT/JP) dated Sep. 25, 2018.

* cited by examiner

SUBSTRATE PROCESSING SYSTEMS, APPARATUS, AND METHODS WITH FACTORY INTERFACE ENVIRONMENTAL CONTROLS

RELATED APPLICATION

The present application claims priority to U.S. Provisional Patent Application No. 61/865,046, filed Aug. 12, 2013, titled "SUBSTRATE PROCESSING SYSTEMS, APPARATUS, AND METHODS WITH FACTORY INTERFACE ENVIRONMENTAL CONTROLS" which is hereby incorporated herein by reference in its entirety for all purposes.

FIELD

Embodiments relates to electronic device manufacturing, and more specifically to equipment front end modules (EFEMs), and apparatus, systems, and methods for processing of substrates.

BACKGROUND

Electronic device manufacturing systems may include multiple process chambers arranged around a mainframe housing having a transfer chamber and one or more load lock chambers configured to pass substrates into the transfer chamber. These systems may employ a transfer robot, which may be housed in the transfer chamber, for example. The transfer robot may be a selectively compliant articulated robot arm (SCARA) robot or the like, and may be adapted to transport substrates between the various chambers and one or more load lock chambers. For example, the transfer robot may transport substrates from process chamber to process chamber, from load lock chamber to process chamber, and vice versa.

Processing of substrates in semi-conductor component manufacturing is generally carried out in multiple tools, where the substrates travel between the tools in substrate carriers (e.g., Front Opening Unified Pods or FOUPs). The FOUPs may be docked to an EFEM (sometimes referred to as a "factory interface or FI"), which includes a load/unload robot therein that is operable to transfer substrates between the FOUPs and the one or more load locks of the tool therefore allowing pass through of substrates for processing. Existing systems may benefit from efficiency and/or process quality improvements.

Accordingly, systems, apparatus, and methods having improved efficiency and/or capability in the processing of substrates are desired.

SUMMARY

In one aspect, an electronic device processing system is provided. The electronic device processing system includes a factory interface including a factory interface chamber, a load lock apparatus coupled to the factory interface, one or more substrate carriers coupled to the factory interface, and an environmental control system coupled to the factory interface and operational to monitor or control one of: a relative humidity, a temperature, an amount of $O_2$, or an amount of an inert gas, within the factory interface chamber.

In another aspect, a method of processing substrates within an electronic device processing system is provided. The method includes providing a factory interface including a factory interface chamber, one or more substrate carriers docked to the factory interface, a load lock apparatus including one or more load lock chambers coupled to the factory interface, and possibly an access door, and controlling environmental conditions in the factory interface chamber to meet environmental preconditions.

In yet another method aspect, a method of processing substrates within an electronic device processing system is provided. The method includes providing a factory interface including a factory interface chamber, one or more substrate carriers docked to the factory interface, one or more carrier purge chambers within the factory interface chamber, and one or more load lock chambers coupled to the factory interface, and controlling environmental conditions in the factory interface chamber and the one or more carrier purge chambers.

Numerous other aspects are provided in accordance with these and other embodiments of the invention. Other features and aspects of embodiments of the present invention will become more fully apparent from the following detailed description, the appended claims, and the accompanying drawings.

BRIEF DESCRIPTION OF THE DRAWINGS

The drawings, described below, are for illustrative purposes only and are not necessarily drawn to scale. The drawings are not intended to limit the scope of the invention in any way.

DESCRIPTION

Reference will now be made in detail to the example embodiments of this disclosure, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

Electronic device manufacturing may desire very precise processing, as well as rapid transport of substrates between various locations. In particular, existing systems may transfer substrates between FOUPs and load locks and then into processing chambers. However, existing systems may suffer from problems when relatively higher humidity, temperature, or other environmental factors, such as too high of an oxygen ($O_2$) level are observed. In particular, exposure to relatively high humidity levels or relatively high $O_2$ levels may adversely affect substrate properties.

According to one or more embodiments of the invention, electronic device processing systems adapted to provide improved substrate processing are provided. The systems and methods described herein may provide efficiency and/or processing improvements in the processing of substrates by controlling environmental conditions within a factory interface chamber of the factory interface. The factory interface receives substrates from one or more substrate carriers docked to the factory interface (e.g., docked to a front surface thereof and a load/unload robot delivers the substrates to one or more load locks coupled on another surface of the factory interface (e.g., a rear surface thereof). In some embodiments, one or more environmental parameters (e.g., a relative humidity, a temperature, an amount of $O_2$, or an amount of an inert gas) are monitored, and neither the one or more load locks or any FOUP docked to the factory interface may be opened unless certain pre-conditions regarding the environment in a factory interface chamber of the factory interface are met.

Further details of example method and apparatus embodiments of the invention are described with reference to FIGS. 1-6 herein.

Figure 1:
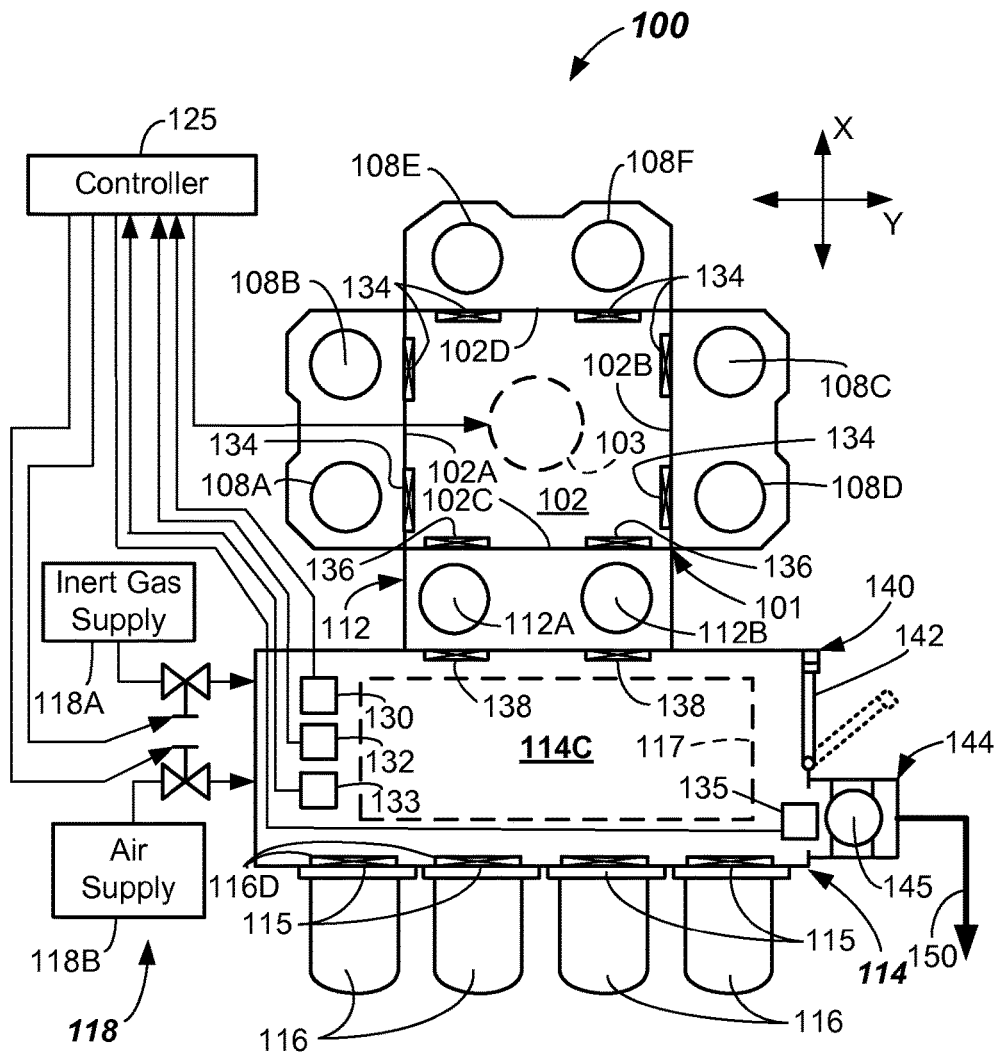
FIG. 1 illustrates a schematic top view of an electronic device processing system including factory interface environmental controls according to embodiments.

FIG. 1 is a schematic diagram of an example embodiment of an electronic device processing system 100 according to one or more embodiments of the present invention. The electronic device processing system 100 may include a mainframe housing 101 having housing walls defining a transfer chamber 102. A transfer robot 103 (shown as a dotted circle) may be at least partially housed within the transfer chamber 102. The transfer robot 103 may be configured and adapted to place or extract substrates to and from destinations via operation of the arms of the transfer robot 103. Substrates as used herein shall mean articles used to make electronic devices or circuit components, such as silica-containing wafers, patterned wafers, or the like.

Transfer robot 103, in the depicted embodiment, may be any suitable type of off-axis robot adapted to service the various twin chambers coupled to and accessible from the transfer chamber 102, such as the robot disclosed in US Patent Pub. No. 2010/0178147, for example. Other off-axis robots may be used. An off-axis robot is any robot configuration that can operate to extend an end effector other than radially towards or away from a shoulder rotational axis of the robot, which is generally centered at the center of the transfer chamber 102.

The motion of the various arm components of the transfer robot 103 may be controlled by suitable commands to a drive assembly (not shown) containing a plurality of drive motors of the transfer robot 103 as commanded from a controller 125. Signals from the controller 125 may cause motion of the various components of the transfer robot 103. Suitable feedback mechanisms may be provided for one or more of the components by various sensors, such as position encoders, or the like.

The transfer robot 103 may include arms rotatable about a shoulder axis, which may be approximately centrally located in the transfer chamber 102. Transfer robot 103 may include a base that is adapted to be attached to a housing wall (e.g., a floor) forming a lower portion of the transfer chamber 102. However, the transfer robot 103 may be attached to a ceiling in some embodiments. The robot 103 may be a dual SCARA robot or other type of dual robot adapted to service twin chambers (e.g., side-by-side chambers). Other types of process chamber orientations, as well as transfer robots may be used.

The rotation of the arm components of the transfer robot 103 may be provided by any suitable drive motor, such as a conventional variable reluctance or permanent magnet electric motor. Arms may be adapted to be rotated in an X-Y plane relative to the base. Any suitable number of arm components and end effectors adapted to carry the substrates may be used.

Additionally, the drive assembly of the transfer robot 103 may include Z-axis motion capability in some embodiments. In particular, the motor housing may be restrained from rotation relative to an outer casing by a motion restrictor. Motion restrictor may be two or more linear bearings or other type of bearing or slide mechanisms that function to constrain rotation of the motor housing relative to the outer casing, yet allow Z-axis (vertical) motion of the motor housing and connected arms along the vertical direction. The vertical motion may be provided by a vertical motor. Rotation of the vertical motor may operate to rotate a lead screw in a receiver coupled to or integral with motor housing. This rotation may vertically translate the motor housing, and, thus, the arms, one or more attached end effectors, and the substrates supported thereon. A suitable seal may seal between the motor housing and the base thereby accommodating the vertical motion, and retaining a vacuum within the transfer chamber 102 in some embodiments.

The transfer chamber 102 in the depicted embodiment may be generally square or slightly rectangular in shape and may include a first facet 102A, second facet 102B opposite the first facet 102A, a third facet 102C, and a fourth facet 102D opposite the third facet 102C. The transfer robot 103 may be preferably adept at transferring and/or retracting dual substrates at a same time into the chamber sets. The first facet 102A, second facet 102B, a third facet 102C, and fourth facet 102D may be generally planar and entryways into the chamber sets may lie along the respective facets. However, other suitable shape of the mainframe housing 101 and numbers of facets and processing chambers is possible.

The destinations for the transfer robot 103 may be a first process chamber set 108A, 108B, coupled to the first facet 102A and which may be configured and operable to carry out a process on the substrates delivered thereto. The process may be any suitable process such as plasma vapor deposition (PVD) or chemical vapor deposition (CVD), etch, annealing, pre-clean, metal ore metal oxide removal, or the like. Other processes may be carried out on substrates therein.

The destinations for the transfer robot 103 may also be a second process chamber set 108C, 108D that may be generally opposed from the first process chamber set 108A, 108B. The second process chamber set 108C, 108D may be coupled to the second facet 102B and may be configured and adapted to carry out any suitable process on the substrates, such as any of the processes mentioned above. Likewise, the destinations for the transfer robot 103 may also be a third process chamber set 108E, 108F that may be generally opposed from the load lock apparatus 112 coupled to the third facet 102C. The third process chamber set 108E, 108F may be configured and adapted to carry out any suitable process on the substrates, such as any of the processes mentioned above.

Substrates may be received into the transfer chamber 102 from a factory interface 114, and also exit the transfer chamber 102, to the factory interface 114, through the load lock apparatus 112 that is coupled to a surface (e.g., a rear wall) of the factory interface 114. The load lock apparatus 112 may include one or more load lock chambers (e.g., load lock chambers 112A, 112B, for example). Load lock chambers 112A, 112B that are included in the load lock apparatus 112 may be single wafer load locks (SWLL) chambers, or multi-wafer chambers. The load lock apparatus 112 may, in some embodiments, include a heating platform/apparatus to heat the substrate to greater than about 200 degrees C., such that a degassing process may be carried out on incoming substrates before they are passed into the transfer chamber 102 from the factory interface 114.

The factory interface 114 may be any enclosure having sidewall surfaces (including front, rear, two side walls, a top, and a bottom) forming a factory interface chamber 114C. One or more load ports 115 may be provided on surfaces (e.g., front surfaces) of the factory interface 114 and may be configured and adapted to receive one or more substrate carriers 116 (e.g., front opening unified pods or FOUPs) thereat.

Factory interface 114 may include a suitable load/unload robot 117 (shown dotted) of conventional construction within the factory interface chamber 114C thereof. The load/unload robot 117 may be configured and operational, once the doors of the substrate carriers 116 are opened, to extract substrates from the one or more substrate carriers 116 and feed the substrates through the factory interface chamber 114C and into the one or more load lock chambers 112A, 112B as may be provided in the load lock apparatus 112. Any suitable construction of the load lock apparatus 112 allowing transfer of substrates between the transfer chamber 102 and the factory interface chamber 114C may be used.

The transfer chamber 102 may include slit valves 134 at an ingress/egress to the various process chambers 108A through 108F. Likewise, load lock chambers 112A, 112B in the one or more load lock apparatus 112 may include inner and outer load lock slit valves 136, 138. Slit valves 134, 136, 138 are adapted to open and close when placing or extracting substrates to and from the various process chambers 108A-108F and load lock chambers 112A, 112B. Slit valves 134, 136, 138 may be of any suitable conventional construction, such as L-motion slit valves.

In the depicted embodiment, the factory interface chamber 114C may be provided with environmental controls providing an environmentally-controlled atmosphere. In particular, environmental control system 118 is coupled to the factory interface 114 and operational to monitor and/or control environmental conditions within the factory interface chamber 114C. In some embodiments, and at certain times, the factory interface chamber 114C may receive an insert gas therein, such as Argon (Ar), Nitrogen ($N_2$), or helium (He), from an inert gas supply 118A. In other embodiments, or at other times, air (e.g., filtered air) may be provided from an air supply 118B.

In more detail, the environmental control system 118 may control at least one of: 1) relative humidity (RH), 2) temperature (T), 3) an amount of $O_2$, or 4) an amount of inert gas, within the factory interface chamber 114C. Other environmental conditions of the factory interface may be monitored and/or controlled, such as gas flow rate or pressure or both.

In some embodiments, environmental control system 118 includes a controller 125. Controller 125 may include suitable processor, memory, and electronic components for receiving inputs from various sensors and controlling one or more valves. Environmental control system 118 may, in one or more embodiments, monitor relative humidity (RH) by sensing RH in the factory interface chamber 114C with a relative humidity sensor 130 that is configured and adapted to sense relative humidity (RH). Any suitable type of relative humidity sensor 130 may be used, such as a capacitive-type sensor. In some embodiments, the controller 125 monitors RH, and when a measured RH value provided to the controller 125 is above a predefined RH threshold value, carrier doors 116D of the one or more substrate carriers 116 coupled to load ports of the factory interface 114 stay closed. Carrier doors 116D of the substrate carriers 116 may be opened when the measured RH value falls below the pre-defined RH threshold value. The RH may be lowered by flowing a suitable amount of an inert gas from the inert gas supply 118A of the environmental control system 118 into the factory interface chamber 114C. As described herein, the inert gas from the inert gas supply 118A may be argon, $N_2$, helium, or mixtures thereof. A supply of dry nitrogen gas ($N_2$) may be quite effective. Compressed bulk inert gases having low $H_2O$ levels (e.g., less than 5 ppm) may be used as the inert gas supply 118A in the environmental control system 118.

In another aspect, the environmental control system 118 measures a relative humidity value with the relative humidity sensor 130, and if the measured relative humidity value is above a pre-defined reference relative humidity value, an outer load lock slit valve 138 of the one or more load lock apparatus 112 coupled to the factory interface 114 stay closed. The one or more load lock apparatus 112 may remain closed until the relative humidity falls below the pre-defined reference relative humidity value. As discussed above, the RH may be lowered by a control signal from the controller 125 to the environmental control system 118 initiating a flow of a suitable amount of an inert gas from the inert gas supply 118A into the factory interface chamber 114C. In one or more embodiments, the pre-defined reference relative humidity value may be less than 1000 ppm moisture, less than 500 ppm moisture, or even less than 100 ppm moisture, depending upon the level of moisture that is tolerable for the particular process being carried out in the electronic device processing system 100.

In some embodiments, the environmental control system 118 of the electronic device processing system 100 may include an air supply 118B coupled to the factory interface chamber 114C. The air supply 118B may be coupled by suitable conduits and one or more valves to the factory interface chamber 114C. The environmental control system 118 may include an oxygen sensor 132 that is configured and adapted to sense a level of oxygen ($O_2$) within the factory interface chamber 114C. In one embodiment, when a person seeks to enter the factory interface chamber 114C, and initiates an entry request, the controller 125 of the environmental control system 118 may initiate a flow of air from the air supply 118B such that at least some of the inert gas environment is exhausted and replaced with air. When a level of oxygen detected within the factory interface chamber 114C reaches a suitable pre-defined $O_2$ level, a door interlock 140 keeping an access door 142 closed may be unlatched to allow the access door 142 to be opened (as shown dotted) and thus allow the person access to the factory interface chamber 114C.

In some embodiments, the factory interface 114 of the electronic device processing system 100 may include a cooling station 144. The cooling station 144 may include one or more platforms, shelves, or other support features upon which one or more substrates 145 exiting the load lock apparatus 112 may rest and be cooled before insertion into a substrate carrier 116.

In one or more embodiments, a temperature sensor 135 that is configured and adapted to sense a temperature within the factory interface chamber 114C may be used. In some embodiments, the temperature sensor 135 may be placed close to the substrate 145. In some embodiments, the temperature sensor 135 may be a directional sensor, such as a laser sensor that may be used to determine an extent to which the substrate 145 has been cooled. This input from the temperature sensor 135 may be used to determine when the transfer from the cooling station 144 may occur.

In the depicted embodiments herein, the controller 125 may be any suitable controller having suitable processor, memory, and peripheral components adapted to receive control inputs from the various sensors (e.g., relative humidity sensor 130, oxygen sensor 132, and/or temperature sensor 135) and execute a closed loop or other suitable control scheme. In one embodiment, the control scheme may change a flow rate of a gas being introduced into the factory interface chamber 114C. In another, the control scheme may determine when to transfer substrates 145 into the factory interface chamber 114C.

Figure 2:
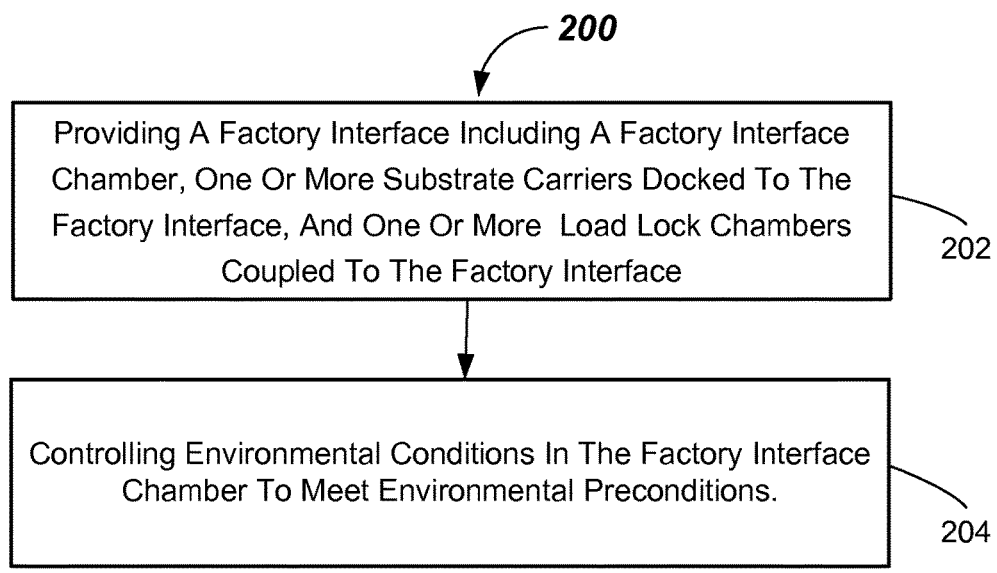
FIG. 2 illustrates a flowchart depicting a method of processing substrates within an electronic device processing system according to embodiments.

Referring now to FIG. 2, one method of processing substrates within an electronic device processing system (e.g., electronic device processing system 100) will be described. The method 200 includes, in 202, providing a factory interface (e.g., factory interface 114) having a factory interface chamber (e.g., factory interface chamber 114C) and one or more substrate carriers (e.g., substrate carriers 116) docked to the factory interface, and one or more load lock chambers (e.g., load lock chambers 112A, 112B) coupled to the factory interface.

The method 200 includes, in 204, controlling environmental conditions to meet environmental preconditions. For example, controlling environmental conditions to meet environmental preconditions may take place before opening any one of the one or more substrate carrier doors (e.g., carrier doors 116D) or the one or more load lock chambers (e.g., opening the outer load lock slit valves 138 of the load lock chambers 112A, 112B).

According to one or more embodiments of the invention, one or more of the carrier doors 116D and the outer load lock slit valves 138 may be opened when certain environmental preconditions are met. For example, environmental preconditions may be met, in one example, when a measured relative humidity (RH) level in the factory interface chamber 114C falls below a predefined relative humidity level threshold (e.g., less than 1000 ppm moisture, less than 500 ppm moisture, less than 100 ppm moisture, or even lower). Other suitable thresholds may be used depending on the processing taking place.

In order to meet, i.e., fall below, previously-failed environmental preconditions, an inert gas (e.g., dry $N_2$ gas or other inert gas) may be flowed into the factory interface chamber 114C from the inert gas supply 118A. The inert gas supply 118A may be a suitable canister of inert gas under pressure, for example. Flow rates of inert gas provided into the factory interface chamber 114C may be monitored by a suitable flow sensor (not shown) on a delivery line and/or pressure sensor 133 located within the factory interface chamber 114C, or both. Flow rates of 400 SLM or more may be provided by adjusting a valve coupled to the inert gas supply 118A responsive to control signals provided by controller 125. Pressures of greater than about 500 Pa may be maintained within the factory interface chamber 114C. Flow of inert gas (e.g., $N_2$ or other inert gas) into the factory interface chamber 114C is operative to lower the relative humidity (RH) level, and the carrier door 116D and/or the outer load lock slit valves 138 of the one or more load lock chambers 112A, 112B may be opened when the relative humidity threshold value if met. This helps to ensure that substrates within the substrate carriers 116 that are opened, any load lock chambers 112A, 112B that are opened, as well as any substrates passing through the factory interface chamber 114C are exposed to only a suitably low humidity environment.

In another example, environmental preconditions may be met, for example, when a measured oxygen ($O_2$) level in the factory interface chamber 114C, as sensed by oxygen sensor 132, falls below a predefined oxygen threshold level (e.g., less than 50 ppm $O_2$, less than 10 ppm $O_2$, less than 5 ppm $O_2$, or even less than 3 ppm $O_2$, or even lower). Other suitable oxygen level thresholds may be used, depending on the processing taking place. If the predefined oxygen threshold level in the factory interface chamber 114C is not met, the controller 125 will initiate a control signal to the valve coupled to the inert gas supply 118A and flow inert gas into the factory interface chamber 114C until the predefined oxygen threshold level is met, as determined by the controller 125. When the predefined oxygen threshold level is met, the carrier door 116D and/or the outer load lock slit valves 138 of the one or more load lock chambers 112A, 112B may be opened. This helps to ensure that substrates within the substrate carriers 116 that are opened, any load lock chambers 112A, 112B that are opened, as well as any substrates passing through the factory interface chamber 114C are exposed to relatively low oxygen levels.

In another example, environmental preconditions may be met, for example, when a measured temperature level in the factory interface chamber 114C, such as a temperature of substrates 145 in the cooling station 144, as sensed by temperature sensor 135, fall below a predefined temperature threshold level (e.g., less than 100 degrees C., or even lower). Once the predefined temperature threshold level is met, cooled substrates 145 may be loaded into a substrate carrier 116 for transport. Cooling station 144 may include cooling platforms, inert gas flow, or combinations thereof.

In some embodiments, an access door 142 of the factory interface 114 may be opened only when certain environmental preconditions are met. For example, the environmental preconditions may include attaining an oxygen value in the factory interface chamber 114C that is above a predetermined oxygen level value that has been determined to be safe. The oxygen level value may be sensed by the oxygen sensor 132, for example. A door interlock 140 (e.g., an electromechanical lock) may prevent the access door 142 from being opened unless the controller 125 determines that the predetermined oxygen level that is deemed to be safe has been met, and sends a signal to open the door interlock 140. If failed, the environmental preconditions may be met by flowing air from the air supply 118B into the factory interface chamber 114C via a control signal to a valve and flowing inert gas out of the factory interface chamber 114C through an exhaust conduit 150. Air supply 118B may be a supply of filtered air provided by a fan or air pump.

Figure 3:
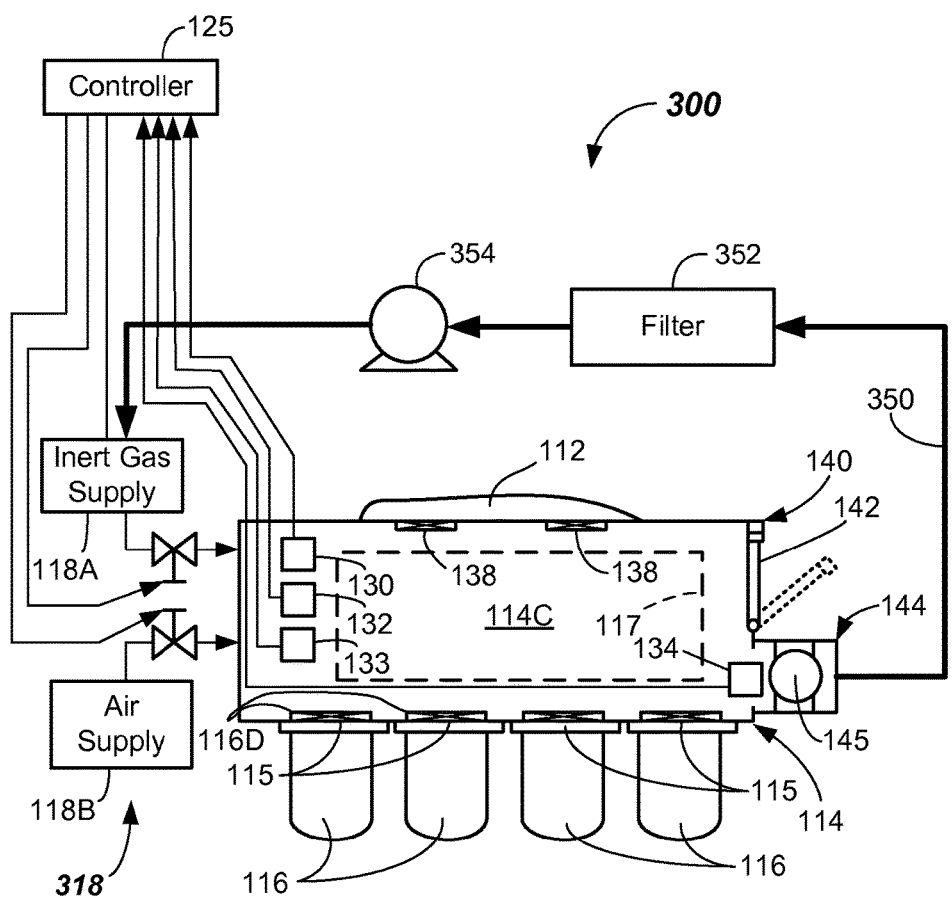
FIG. 3 illustrates a schematic top view of an electronic device processing system including an inert gas recirculation system according to embodiments.

As is shown in FIG. 3, another embodiment of electronic device processing system 300 is provided (the mainframe housing, processing chambers, and load lock chambers not shown for clarity). The environmental control system 318 of the electronic device processing system 300 may include the components previously mentioned, but may also include inert gas recirculation. In particular, the inert gas may be recycled and reused in order to provide more efficient environmental controls of the factory interface 114. For example, in the depicted embodiment, the inert gas from the factory interface chamber 114C may be exhausted in an exhaust conduit 350 from the factory interface chamber 114C, filtered through a filter 352, which may be a moisture-reducing filter and also may filter particulates, and then may be pumped back into the inert gas supply 118A by a pump 354. The filter 352 may be a moisture absorbent filter, which may include multiple layers of absorbent materials. However, other mechanisms or devices for reducing moisture content, such as condensers or other moisture removers may be used. In some embodiments, the inert gas may also be cooled.

Inert gas consumption may be monitored in some embodiments, such as by use of a flow sensor (not shown) in the delivery line from the inter gas supply 118A and the measured flow rate may be correlated to attaining a specified RH value within the factory interface chamber 114C. If the amount of inert gas consumption is outside of a pre-established limit, then a leak in the factory interface chamber 114C may be flagged, such as by an message to an operator, a visual indicator, an alarm, or the like. Optionally, if a pressure within the factory interface chamber 114C is outside (e.g., below) a pre-established limit, then a leak in the factory interface chamber 114C may be flagged, as above.

Figure 4:
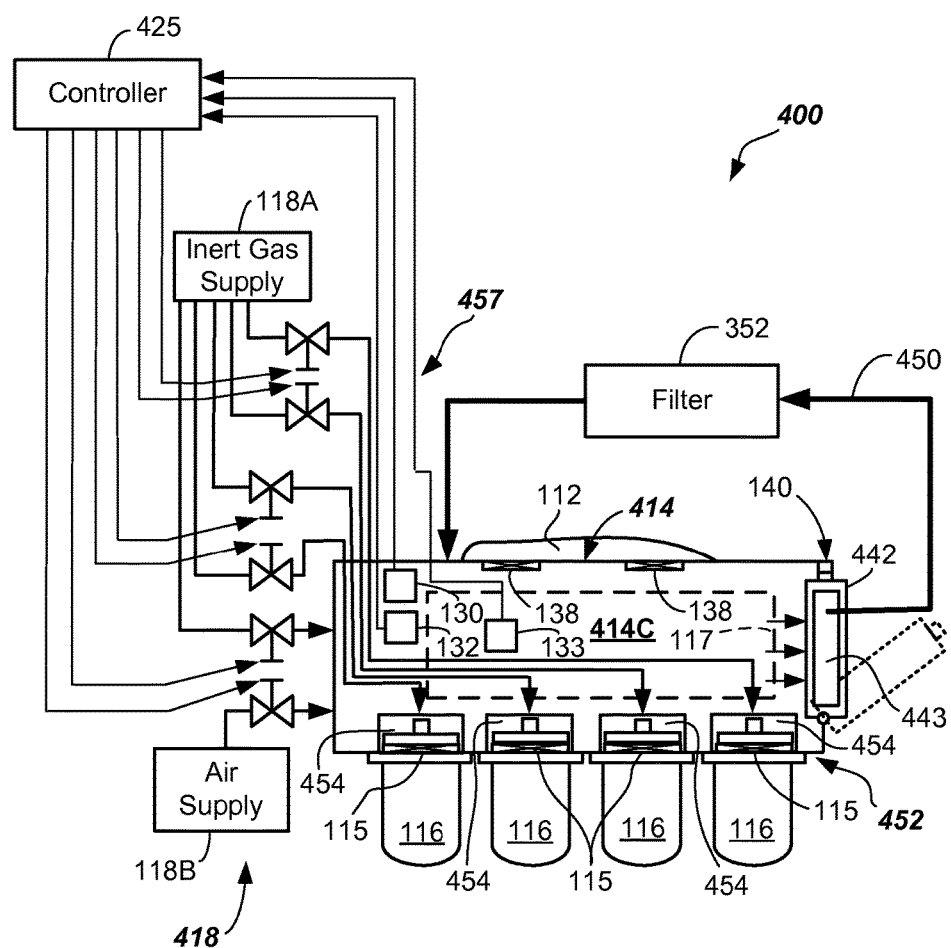
FIG. 4 illustrates a schematic top view of another electronic device processing system including environmental controls and inert gas recirculation according to embodiments.

FIG. 4 illustrates another embodiment of electronic device processing system 400 including an environmental control system 418. In this embodiment, the environmental control system 418 includes a combination of environmental control of the factory interface chamber 414C coupled with environmental control of one or more carrier purge chambers 454. Otherwise, this embodiment is similar to the FIG. 3 embodiment, except that a carrier purge system 452 is provided.

Carrier purge system 452, which may be capable of independent usage apart from the environmental control of the factory interface chamber 414C, includes a gas purge system 457. Gas purge system 457 includes the inert gas supply (e.g., inert gas supply 118A) and a plurality of supply conduits and valves coupled thereto. The plurality of supply conduits and valves of the gas purge system 457 supply inert gas to the carrier purge chambers 454 at certain times responsive to control signals from the controller 425. For example, the supply of inert gas may be provided to a carrier purge chamber 454 just after opening a carrier door 116D of a substrate carrier 116 in order to purge the environment 562 (FIG. 5A) of the substrate carrier 116 and the carrier purge chamber 454 to meet certain environmental preconditions before transferring substrates 545 from the substrate carrier 116 into the factory interface chamber 114C.

Figure 5A:
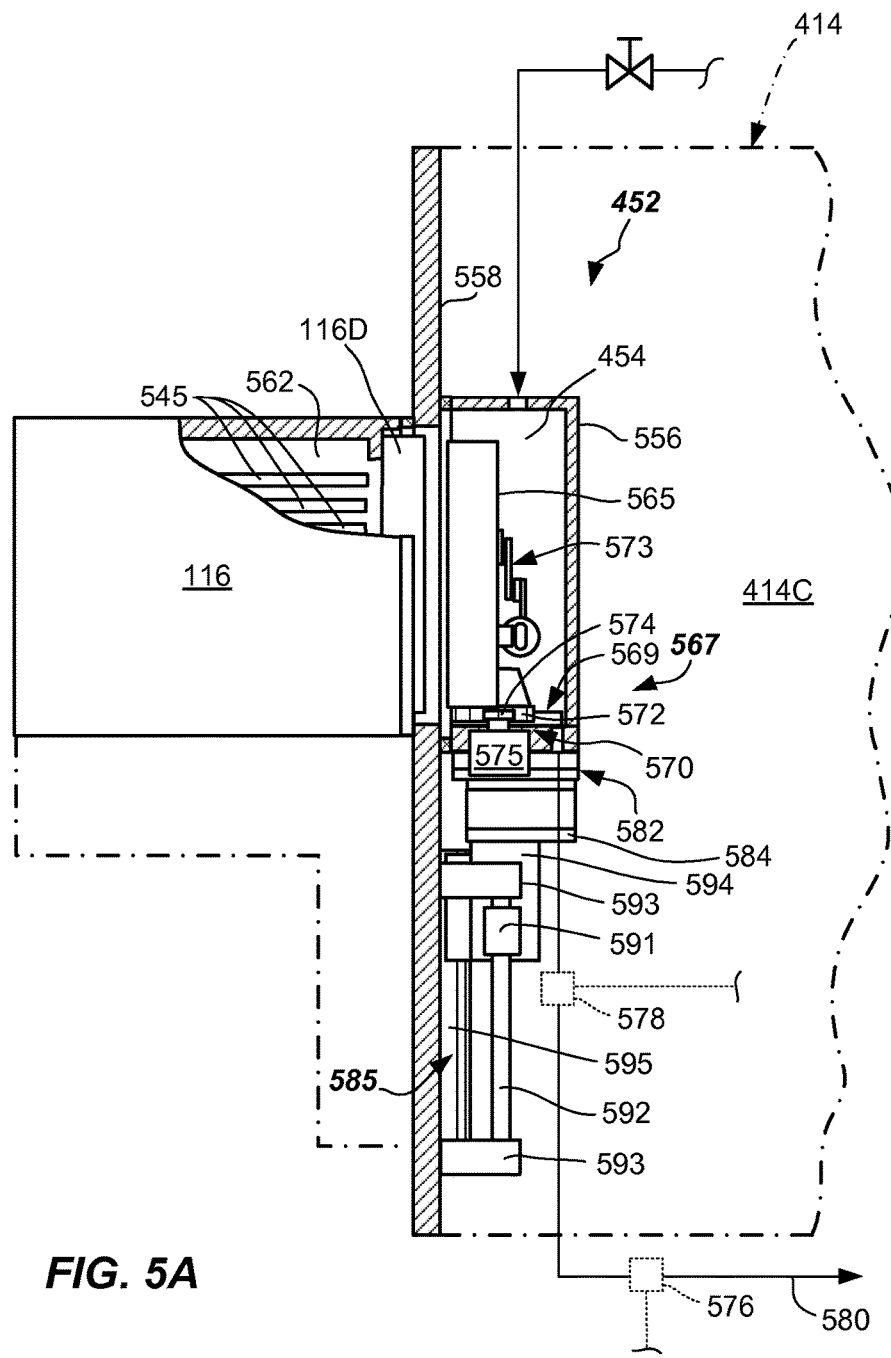
FIG. 5A illustrates a cross-sectioned side view of a carrier purge assembly according to embodiments.
Figure 5B:
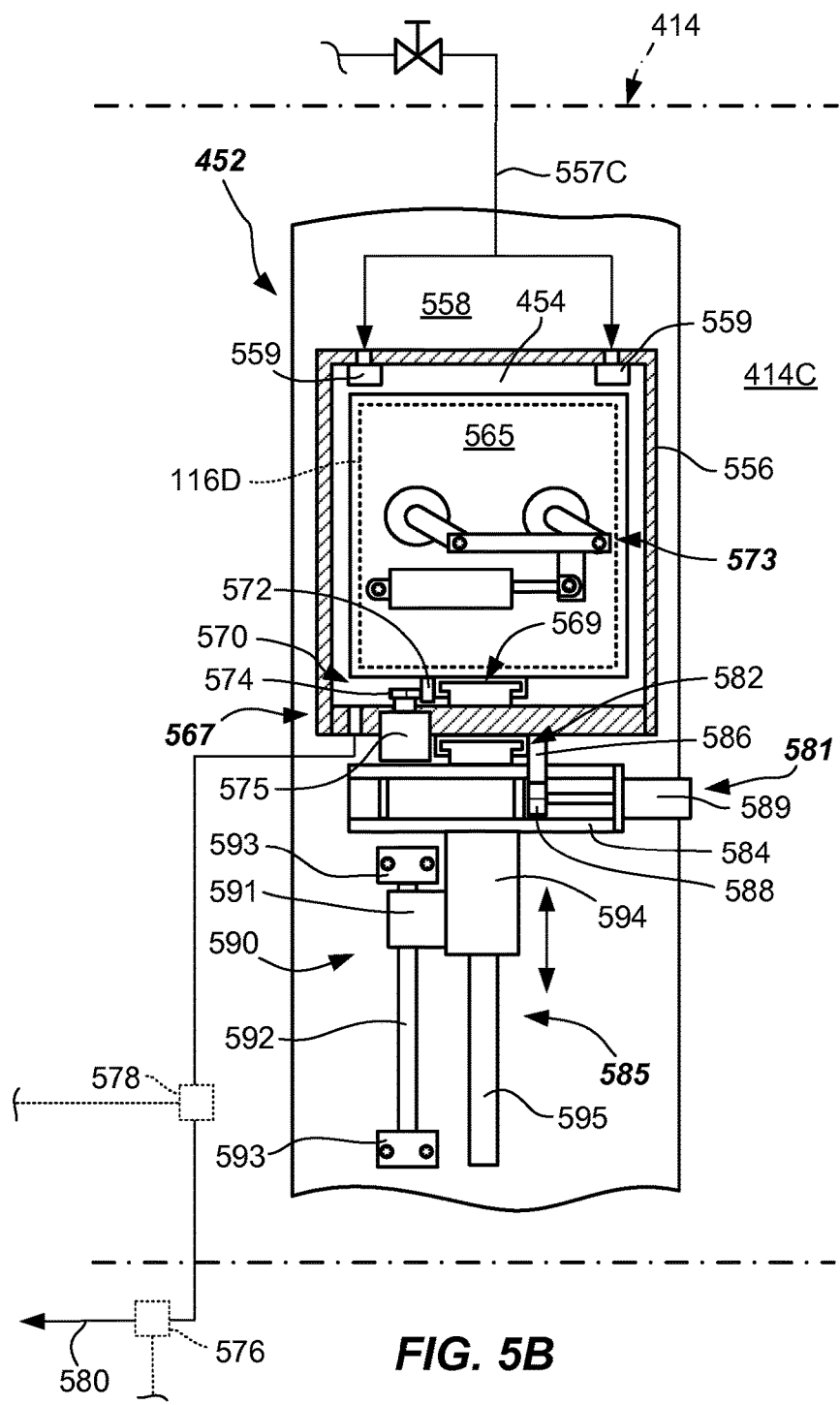
FIG. 5B illustrates a front view of a carrier purge assembly according to embodiments.

The details and the components and operation of the carrier purge system 452 of the factory interface 414 will now be described with reference to FIGS. 4 and 5A-5B. Carrier purge system 452 includes a carrier purge housing 556 for each substrate carrier 116 including purge capability. Such purge capability may be included for some or all of the substrate carriers 116. Carrier purge housing 556 forms a part of each carrier purge chamber 454. Carrier purge housing 556 may seal against a surface of an inside wall 558 of the factory interface 114 (e.g., a front wall) and form the carrier purge chamber 454. Carrier purge housing 556 remains sealed against the surface of an inside wall 558 as the carrier door 116D is opened. Any suitable seal may be used, such as a gasket or O-ring.

The carrier purge system 452 is adapted to receive the environment 562 of the substrate carrier 116 into a carrier purge chamber 454 upon opening a carrier door 116D thereof via operation of a door opener 565 and the door retraction mechanism 567. Once the carrier door 116D is opened, purging of the carrier purge chamber 454 may take place so that the environment 562, which may contain undesirable levels of $O_2$ or moisture, does not enter the factory interface chamber 114C. Purging of the carrier purge chamber 454 continues until certain predefined environmental conditions are met. Purging may be provided via inert gas provided from the gas purge system 457. One or more diffusers 559 may be included at the exits from a conduit 557C of the gas purge system 457 supplying inert gas into the carrier purge chamber 454.

The environmental conditions may be based upon a predefined relative humidity RH threshold level and/or a predefined $O_2$ threshold level, for example. For example, a relative humidity of less than a predefined RH threshold level (e.g., less than about 5% moisture–less than about 50,000 ppm) may be sought before retracting the carrier purge housing 556 away from the inside wall 558 and lowering the carrier purge housing 556 to allow the load/unload robot 117 to access and remove the substrates 545. If the oxygen level is the environmental criteria, then an $O_2$ threshold level of less than a predefined threshold level (e.g., less than about 500 ppm $O_2$) may be sought before retracting and lowering the carrier purge housing 556. Other predefined threshold levels may be used.

In order to attain one or both of these threshold levels, a chamber relative humidity sensor 576 and/or a chamber oxygen sensor 578 may be provided that interconnect with the controller 425. Chamber relative humidity sensor 576 and/or a chamber oxygen sensor 578 may be on the carrier purge housing 556, in a chamber exhaust conduit 580 within the factory interface chamber 114C, or even outside of the factory interface 114, such as on the chamber exhaust conduit 580. Purging with inert gas from the gas purge system 457 may continue until the environmental preconditions are met. In some embodiments, purging for a certain pre-established time or volume, based upon previously-performed experiments, may be used to ensure that the environmental preconditions are met.

In operation, the carrier purge housing 556 surrounds a door opener 565. The door opener 565 is adapted to be retractable within an interior of the carrier purge housing 556. Retraction of the door opener 565 may be by a door retraction mechanism 567, such as a linear slide 569 and a rack and pinion mechanism 570. Rack and pinion mechanism 570 may include a rack 572, pinion 574, and drive motor 575 coupled to the pinion 574. Drive signals from the controller 425 to the drive motor 575 causes retraction of the carrier door 116D and mixing of the environment 562 with that in the carrier purge chamber 454. Any door unlock and grasp mechanism 573 may be used on the door opener 565 to grasp and open the carrier door 116D, as is conventional.

Retraction from and closure (e.g., sealing) against the inside wall 558 by the carrier purge housing 556 may be provided by a housing drive system 581 and slide mechanism 582. Slide mechanism 582 allows linear motion towards and away from the inside wall 558 relative to a support frame 584 that attaches to an elevator 585. Housing drive system 581 may include a suitable motor and transmission mechanism to cause the motion towards and away from the inside wall 558. In the depicted embodiment, a rack and pinion mechanism is shown, including housing rack 586 coupled to the carrier purge housing 556, housing pinion 588, and housing drive motor 589. Driving the housing drive motor 589 translates the carrier purge housing 556 horizontally in or out relative to the elevator 585 and the inside wall 558.

Lowering of the carrier purge housing 556 may be provided by the elevator 585. Elevator 585 may include any suitable mechanism construction for providing vertical motion of the carrier purge housing 556. For example, as depicted, the elevator 585 includes a linear bearing assembly 590 including a bearing slide 591, rail 592, and mounting blocks 593. Mounting blocks 593 may fasten the rail 592 to the inside wall 558. Bearing slide 591 may fasten to a vertical actuator 594. A Vertical actuator rail 595 may also be provided, and may be fastened to the inside wall 558. Actuation of the vertical actuator 594 causes vertical motion relative to the vertical actuator rail 595, raising or lowering the support frame 584 and the coupled carrier purge housing 556. Vertical actuator 594 may be any suitable actuator type, such as pneumatic, electrical, or the like. Thus, it should be apparent that operation of the door grasp and unlock mechanism 573 grasps and opens the carrier door 116D, the rack and pinion mechanism 570 retracts the carrier door 116D, the carrier purge system 452 purges the carrier purge chamber 454 to meet environmental preconditions, the housing drive system 581 retracts the carrier purge housing 556, and the elevator 585 lowers the carrier purge housing 556 and carrier door 116D so that the load/unload robot 117 may access the substrates 545 in the substrate carrier 116.

Again referring to FIG. 4, the environmental control system 418 may include the components previously mentioned, and may also include inert gas recirculation. For example, the inert gas may be exhausted in an exhaust conduit 450 from the factory interface chamber 414C, and filtered through filter 352, which may be a moisture-reducing filter, but may also filter particulates, and may be of the type discussed above. In this embodiment, the filtered inert gas may be recirculated directly back into the factory interface chamber 414C.

For example, in the depicted embodiment, a portion of the exhaust circulation route may be through the chamber door 442. For example, the exhaust from the factory interface chamber 414C may enter into a channel 443 (e.g., a duct) formed in the chamber door 442. Channel 443 may have an entrance from the factory interface chamber 414C at or near a bottom of the chamber door 442, and progress to above the filter 352, which may be within an upper part of the factory interface chamber 414C in some embodiments. Thus, channel 443 may be part of the exhaust conduit 450. A door similar to chamber door 442 including an internal channel, like channel 443, may be provided on the other side of the factory interface 414 in some embodiments.

Figure 6:
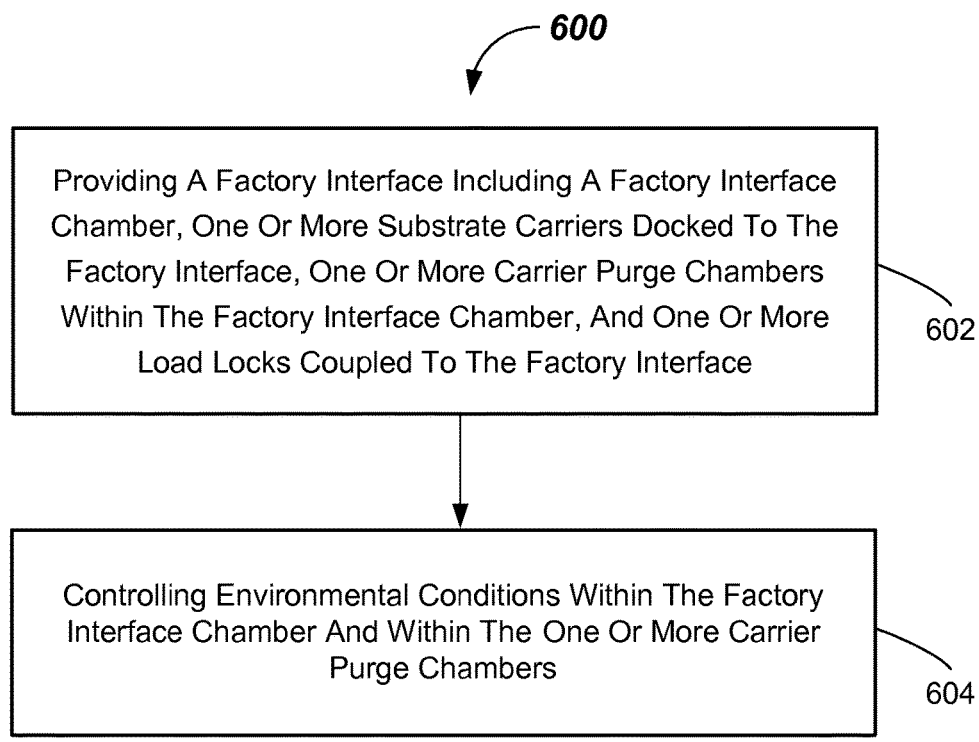
FIG. 6 illustrates another flowchart depicting a method of processing substrates within an electronic device processing system according to embodiments.

Referring now to FIG. 6, another method of processing substrates within an electronic device processing system (e.g., electronic device processing system 400) will be described. The method 600 includes, in 602, providing a factory interface (e.g., factory interface 414) having a factory interface chamber (e.g., factory interface chamber 414C), one or more substrate carriers (e.g., substrate carriers 116) docked to the factory interface, one or more carrier purge chambers (e.g., carrier purge chambers 454) within the factory interface chamber, and one or more load lock chambers (e.g., load lock chambers 112A, 112B of load lock apparatus 112) coupled to the factory interface.

The method 600 includes, in 604, controlling environmental conditions within the factory interface (e.g., factory interface 414) and within the one or more carrier purge chambers (e.g., carrier purge chambers 454). Controlling environmental conditions within the factory interface may include meeting environmental preconditions in the factory interface chamber before allowing the opening any one of the one or more substrate carrier doors (e.g., carrier doors 116D) or any one of the one or more load lock chambers (e.g., the outer load lock slit valves 138 of the load lock chambers 112A, 112B). Controlling environmental conditions within the one or more carrier purge chambers (e.g., carrier purge chambers 454) may include meeting certain environmental preconditions (e.g., on RH threshold level or an $O_2$ threshold level) before unsealing via retraction and lowering the carrier purge housing 556, as discussed above. Providing such environmental controls in accordance with embodiments of the invention may reduce exposure of the substrates 545 exiting the substrate carriers 116 or exiting the load lock chambers 112A, 112B after processing to environmental conditions that may be detrimental, such as relatively humid environments or environments with relatively high $O_2$ levels.

The foregoing description discloses only example embodiments of the invention. Modifications of the above-disclosed apparatus, systems and methods which fall within the scope of the invention will be readily apparent to those of ordinary skill in the art. Accordingly, while the present invention has been disclosed in connection with example embodiments, it should be understood that other embodiments may fall within the scope of the invention, as defined by the following claims.

The invention claimed is:

1. A method of processing substrates within an electronic device processing system, comprising:

providing a factory interface including a factory interface chamber, one or more substrate carriers docked to the factory interface, each of the one or more substrate carriers having a substrate carrier door, one or more carrier purge chambers within the factory interface chamber, and one or more load lock chambers coupled to the factory interface;

sealing a carrier purge housing to the factory interface chamber, the carrier purge housing having a carrier purge chamber located therein, the sealing covering a substrate carrier door and isolating the carrier purge chamber from the factory interface chamber;

monitoring one or more environmental conditions in the carrier purge chamber;

setting one or more environmental conditions in the carrier purge chamber in response to the monitoring;

opening the substrate carrier door by attaching a door opener to the substrate carrier door, the door opener being attached to a rack and pinion, the rack located within the carrier purge chamber, the pinion being attached to a motor at least partially located external to the carrier purge chamber; and unsealing the carrier purge housing from the factory interface.

2. An electronic device processing system, comprising:

a factory interface including a factory interface chamber;

a load lock apparatus coupled to the factory interface;

one or more substrate carriers coupled to the factory interface at one or more load ports, the one or more substrate carriers having a carrier door configured to pass through a load port in the factory interface; and a carrier purge housing having a carrier purge chamber therein, the carrier purge housing being movable between a sealed position isolating the carrier purge chamber from the factory interface chamber and covering a load port and an unsealed position removed from the load port;

a door opener configured to be retractable in the carrier purge chamber;

a rack attached to the door opener and located within the carrier purge chamber;

a pinion in contact with to the rack;

a drive motor coupled to the pinion and configured to rotate the pinion, the drive motor located at least partially external to the carrier purge chamber;

one or more sensors configured to monitor a level of one or more gases in the carrier purge chamber; and a controller configured to control gas flow into the carrier purge chamber in response to the monitoring to set the level of the one or more gases to a predetermined level.

3. The electronic device processing system of claim 2, comprising an environmental control system coupled to the factory interface and operational to monitor and change the level of one of:
 a relative humidity,
 a temperature,
 an amount of $O_2$, or
 an amount of an inert gas,
within the factory interface chamber.

4. The electronic device processing system of claim 3 wherein the inert gas comprises argon, $N_2$ gas, or helium.

5. The electronic device processing system of claim 2 comprising a humidity sensor adapted to sense relative humidity of the carrier purge chamber.

6. The electronic device processing system of claim 2 comprising an oxygen sensor adapted to sense an oxygen level of the carrier purge chamber.

7. The electronic device processing system of claim 2, wherein the controller is adapted to monitor and control at least one of:
 relative humidity or
 an amount of $O_2$,
within the carrier purge chamber.

8. The electronic device processing system of claim 7, wherein an environmental control system comprises an inert gas supply responsive to the controller and adapted to flow an amount of inert gas into the carrier purge chamber to set the level of the one or more gases to the predetermined level.

9. The electronic device processing system of claim 2, comprising an air supply coupled to the factory interface chamber.

10. The electronic device processing system of claim 2 comprising a temperature sensor adapted to sense a temperature within the factory interface chamber.

11. The electronic device processing system of claim 2 comprising a temperature sensor adapted to sense a temperature of a substrate received in a cooling station of the factory interface.

12. The electronic device processing system of claim 2, wherein the controller is configured to control gas flow through a gas inlet conduit into the carrier purge chamber.

13. The electronic device processing system of claim 12 wherein the carrier purge chamber is adapted to receive a carrier environment of the substrate carrier upon opening a carrier door thereof, and purge the carrier purge chamber during a period when the carrier purge housing is in the sealed position.

14. The electronic device processing system of claim 2 wherein the carrier purge chamber is adapted to remain in the sealed position until one or more predetermined environmental conditions within the carrier purge chamber are met.

15. The electronic device processing system of claim 2, further comprising a door retraction mechanism including a slide.

16. The electronic device processing system of claim 2, further comprising:
 a housing rack and pinion attached to an exterior of the carrier purge housing.

17. A method of processing substrates within an electronic device processing system, comprising:
 providing a factory interface including:
  a factory interface chamber,
  one or more substrate carriers docked to the factory interface, each of the one or more substrate carriers having a substrate carrier door,
  a load lock apparatus including one or more load lock chambers coupled to the factory interface, and
 controlling environmental conditions in the factory interface chamber to meet one or more environmental preconditions;
 sealing a carrier purge housing to the factory interface chamber, the carrier purge housing having a carrier purge chamber therein, the sealing covering a substrate carrier door with the carrier purge chamber and isolating the carrier purge chamber from the factory interface chamber;
 opening the substrate carrier door by attaching a door opener to the substrate carrier door, the door opener attached to a rack and pinion, the rack being located within the carrier purge housing, and the pinion coupled to a motor located at least partially external to the carrier purge housing;
 monitoring one or more environmental conditions in the carrier purge chamber;
 controlling the one or more environmental conditions in the carrier purge chamber in response to the monitoring to meet one or more predetermined environmental conditions; and
 retracting the carrier purge housing from the factory interface after the one or more environmental conditions in the carrier purge chamber has met the one or more predetermined environmental conditions.

18. The method of claim 17, comprising meeting the one or more environmental preconditions within the factory interface chamber before opening a substrate carrier door of the one or more substrate carriers, one or more load lock chambers, or an access door.

19. The method of claim 17, wherein the one or more predetermined environmental conditions within the carrier purge chamber comprise one or more of:
 a relative humidity below a predefined relative humidity threshold, or
 an amount of $O_2$ below a predefined $O_2$ threshold.

20. The method of claim 17, wherein the one or more predetermined environmental conditions are met by flowing an inert gas into the carrier purge chamber.

21. The method of claim 17, comprising:
 controlling inert gas provided to the carrier purge chamber to purge an environment of the carrier purge chamber upon opening a substrate carrier door of the substrate carrier.

22. The method of claim 17, wherein the one or more predetermined environmental conditions include both a relative humidity threshold and an $O_2$ level threshold, and comprising retracting the carrier purge housing only when both of the relative humidity threshold and the $O_2$ level threshold are met.

23. The method of claim 17, comprising opening an access door in the factory interface when the environmental preconditions comprise an oxygen value above a predetermined value.

* * * * *